United States Patent
Chen et al.

(10) Patent No.: US 9,830,553 B2
(45) Date of Patent: Nov. 28, 2017

(54) CODE GENERATION METHOD, CODE GENERATING APPARATUS AND COMPUTER READABLE STORAGE MEDIUM

(71) Applicant: THOMSON LICENSING, Issy les Moulineaux (FR)

(72) Inventors: Xiaoming Chen, Hannover (DE); Meinolf Blawat, Hannover (DE); Klaus Gaedke, Schaumannweg (DE); Ingo Huetter, Pattensen (DE)

(73) Assignee: THOMSON LICENSING, Issy-les-Moulineaux ( * ) Notice: Subject to any disclaimer, the term of this patent is extended or adjusted under 35 U.S.C. 154(b) by 0 days.

(21) Appl. No.: 15/502,528

(22) PCT Filed: Jul. 31, 2015

(86) PCT No.: PCT/EP2015/067654
§ 371 (c)(1),
(2) Date: Feb. 8, 2017

(87) PCT Pub. No.: WO2016/020280
PCT Pub. Date: Feb. 11, 2016

(65) Prior Publication Data
US 2017/0243115 A1    Aug. 24, 2017

(30) Foreign Application Priority Data

Aug. 8, 2014 (EP) .................................... 14306259

(51) Int. Cl.
*G06N 3/12* (2006.01)
*G11C 13/00* (2006.01)
*H03M 5/14* (2006.01)

(52) U.S. Cl.
CPC ......... *G06N 3/123* (2013.01); *G11C 13/0019* (2013.01); *H03M 5/145* (2013.01)

(58) Field of Classification Search
None
See application file for complete search history.

(56) References Cited

U.S. PATENT DOCUMENTS

| 2007/0190656 A1* | 8/2007 | Crain | ..................... B82Y 10/00 436/63 |
| 2014/0361911 A1* | 12/2014 | Kennedy | ................ G06N 3/123 341/87 |

OTHER PUBLICATIONS

Blahut, "Algebraic Codes for Data Transmission", Cambridge University Press, Cambridge, United Kingdom, 2003, pp. 1-19.

* cited by examiner

*Primary Examiner* — Howard Williams
(74) *Attorney, Agent, or Firm* — Brian J. Dorini; Patricia A. Verlangieri

(57) ABSTRACT

A code book is generated for mapping source to target code words which allows encoding source data at reduced probability of incorrect decoding, e.g. for DNA storage. The target code words are grouped (102) into subsets and comprise identifying and remaining portions. The identifying portions of target code words corresponding to a same subset are identical. A first code symbol set of source code words is selected (103) for addressing the subsets. For the subsets, neighboring subsets are determined (104). The identifying portions of the target code words of neighboring subsets differ from those of the corresponding subset by up to a predetermined amount of symbols. Source code words are assigned (105) where the corresponding first code symbols address the same subset to said subset such that an amount (Continued)

of target code words of said subset having their remaining portions identical to their neighboring subsets corresponds to an optimization criterion.

13 Claims, 4 Drawing Sheets

CODE GENERATION METHOD, CODE GENERATING APPARATUS AND COMPUTER READABLE STORAGE MEDIUM

This application claims the benefit, under 35 U.S.C. §365 of International Application PCT/EP2015/067654 filed Jul. 31, 2015, which was published in accordance with PCT Article 21(2) on Feb. 11, 2016, in English, and which claims the benefit of European Application No. 14306259.4 filed Aug. 8, 2014. The European and PCT applications are expressly incorporated by reference herein in their entirety for all purposes.

FIELD

A code generation method and apparatus are presented. In particular, the present disclosure relates to a method and an apparatus for mapping source code words to target code words, for example suitable for encoding of information for storage in synthetic nucleic acid strands, and to a corresponding computer readable storage medium.

BACKGROUND

A nucleic acid is a polymeric macromolecule and consists of a sequence of monomers known as nucleotides. Each nucleotide consists of a sugar component, a phosphate group and a nitrogenous base or nucleobase. Nucleic acid molecules where the sugar component of the nucleotides is deoxyribose are DNA (deoxyribonucleic acid) molecules, whereas nucleic acid molecules where the sugar component of the nucleotides is ribose are referred to as RNA (ribonucleic acid) molecules. DNA and RNA are biopolymers appearing in living organisms.

Nucleic acid molecules are assembled as chains or strands of nucleotides. Nucleic acid molecules can be generated artificially and their chain structure can be used for encoding any kind of user data. For storing data in synthesized, i.e. artificially created, DNA or RNA, usually short DNA or RNA fragments (oligonucleotides, short: oligos) are generated. With these nucleic acid fragments, a data storage system can be realized wherein data are stored in nucleic acid molecules. The synthesized nucleic acid molecules carry the information encoded by the succession of the different nucleotides forming the nucleic acid molecules. Each of the synthesized nucleic acid molecules consists of a sequence or chain of nucleotides generated by a bio-chemical process using a synthesizer and represents an oligo or nucleic acid fragment wherein the sequence or cascade of the nucleotides encodes a code word sequence corresponding to a set of information units, e.g., sets of information bits of user data. For example, in a DNA storage system, short DNA fragments are generated. These molecules can be stored and the information can be retrieved from the stored molecules by reading the sequence of nucleotides using a sequencer.

Sequencing is a process of determining the order of nucleotides within the particular nucleic acid fragment. Sequencing can be interpreted as a read process. The read out order of nucleotides is processed or decoded to recover the original information stored in the nucleic acid fragment.

In this context, the terms "nucleic acid fragment", "oligonucleotide" and "oligo" are used interchangeably and refer to a short nucleic acid strand. The term "short" in this context is to be understood as short in comparison to a length of natural DNA which encodes genetic instructions used by living organisms and which may consist of millions of nucleotides. Synthesized oligos may contain more than one, for example more than hundred, e.g. between 100 and 300, or several thousands of nucleotides.

This technology enables a provision of data storage systems wherein a write process is based on the creation of nucleic acid fragments as sequences of nucleotides which encode information to be stored.

The generated nucleic acid fragments are stored, for example as solid matter or dissolved in a liquid, in a nucleic acid storage container. The characteristics of the nucleic acid storage may depend on the amount of stored data and an expected time before a readout of the data will take place.

Digital information storage in synthesized DNA or RNA may provide a high-capacity, low-maintenance information storage.

DNA storage has been investigated in "Next-generation digital information storage", Church et al., Science 337, 1628, 2012, and in "Towards practical, high-capacity, low-maintenance information storage in synthesized DNA", Goldman et al., Nature, vol. 494, 2013.

The data can be any kind of sequential digital source data to be stored, e.g., sequences of binary or quaternary code symbols, corresponding to digitally, for example binary, encoded information, such as textual, image, audio or video data. Due to the limited oligo length, the data is usually distributed to a plurality of oligos.

In such a nucleic acid storage system the oligos are subject to several processing stages: The oligos are synthesized, i.e. nucleic acid strands to be stored are created, amplified, i.e., the number of each single oligo is increased, e.g., to several hundreds or thousands, and sequenced, i.e., the sequence of nucleotides for each oligo is analyzed. These processing stages can be subject to errors, resulting in non-decodable or incorrectly decoded information.

DNA strands consist of four different nucleotides identified by their respective nucleobases or nitrogenous bases, namely, Adenine, Thymine, Cytosine and Guanine, which are denoted shortly as A, T, C and G, respectively. RNA strands also consist of four different nucleotides identified by their respective nucleobases, namely, Adenine, Uracil, Cytosine and Guanine, which are denoted shortly as A, U, C and G, respectively.

The information is stored in sequences of the nucleotides. Regarded as an information transmission system, such mapping from information bits to different nucleotides can be interpreted as modulation with A, T, C, G as modulation symbols (or A, U, C and G, respectively), where the symbol alphabet size is 4. Reversely, the decision rule from a given symbol tuple or target code word to an information bit tuple or source code word can be referred to as demodulation.

Nucleobases tend to connect to their complementary counterparts via hydrogen bonds. For example, natural DNA usually shows a double helix structure, where A of one strand is connected to T of the other strand, and, similarly, C tends to connect to G. In this context, A and T, as well as C and G, are called complementary. Correspondingly, A with U and G with C form pairs of complementary RNA bases.

Two sequences of nucleotides are considered "reverse complementary" to each other, if an antiparallel alignment of the nucleotide sequences results in the nucleobases at each position being complementary to their counterparts. Reverse complementarity does not only occur between separate strands of DNA or RNA. It is also possible for a sequence of nucleotides to have internal or self-reverse complementarity. As an example, a DNA fragment is considered self-reverse complementary, if the fragment is identical to itself after complementary, reversing steps. For example, a DNA fragment AATCTAGATT is self-reverse complementary: original DNA fragment —AATCTAGATT; complementary—TTAGATCTAA; order reversing—AATCTAGATT.

Long self-reverse complementary fragments may not be readily sequenced which hinders correct decoding of the information encoded in the strand.

Further, tests have shown that nucleotide run lengths, i.e. cascades or sequences of identical nucleotides may reduce sequencing accuracy if the run length exceeds a certain length.

Furthermore, as the amplification process and the sequencing introduce errors in the oligos at different locations, many sequenced oligos may not contain the correct information.

Therefore, a specific modulation coding should be used that allows encoding of information or source data at a high coding efficiency while having a reduced probability of incorrect decoding.

SUMMARY

According to an aspect of the present principles, a computer-implemented code book generation method for mapping a plurality of source code words to a plurality of target code words comprises
providing a plurality of source code words and a plurality of target code words;
grouping the plurality of target code words into a plurality of subsets of the target code words, the target code words comprising an identifying portion and a remaining portion, wherein the identifying portions of the target code words corresponding to a same subset of the plurality of subsets are identical;
selecting a first set of code symbols of the source code words for addressing the plurality of subsets;
determining for the subsets one or more corresponding neighboring subsets within the plurality of subsets, wherein the identifying portions of the target code words of the one or more neighboring subsets differ from the identifying portion of the target code words of the corresponding subset by up to a predetermined amount of code symbols; and
assigning source code words where the corresponding first set of code symbols addresses the same subset, to target code words of said subset such that an amount of the target code words of said subset said source code words are assigned to, having their remaining portions identical to the corresponding remaining portions of the target code words of their neighboring subsets corresponds to an optimization criterion, e.g. is maximized.

Accordingly, a code generating apparatus for mapping a plurality of source code words to a plurality of target code words comprises
a first input (501) for receiving target code words and a second input (502) for receiving source code words;
a code word grouping unit configured to group the plurality of target code words into a plurality of subsets of the target code words, the target code words comprising an identifying portion and a remaining portion, wherein the identifying portions of the target code words corresponding to a same subset of the plurality of subsets are identical;
a selection unit connected to the code word grouping unit and configured to select a first set of code symbols of the source code words for addressing the plurality of subsets;
a determining unit connected to the code word grouping unit and configured to determine for the subsets one or more corresponding neighboring subsets within the plurality of subsets, wherein the identifying portions of the target code words of the one or more neighboring subsets differ from the identifying portion of the target code words of the corresponding subset by up to a predetermined amount of code symbols; and
a mapping unit connected to the selection unit and the determining unit and configured to assign source code words where the corresponding first set of code symbols addresses the same subset, to target code words of said subset such that an amount of the target code words of said subset said source code words are assigned to, having their remaining portions identical to the corresponding remaining portions of the target code words of their neighboring subsets corresponds to an optimization criterion, e.g. is maximized.

Further, a computer readable storage medium has stored therein instructions enabling mapping a plurality of source code words to a plurality of target code words, which, when executed by a computer, cause the computer to:
provide a plurality of source code words and a plurality of target code words;
group the plurality of target code words into a plurality of subsets of the target code words, the target code words comprising an identifying portion and a remaining portion, wherein the identifying portions of the target code words corresponding to a same subset of the plurality of subsets are identical;
select a first set of code symbols of the source code words for addressing the plurality of subsets;
determine for the subsets one or more corresponding neighboring subsets within the plurality of subsets, wherein the identifying portions of the target code words of the one or more neighboring subsets differ from the identifying portion of the target code words of the corresponding subset by up to a predetermined amount of code symbols; and
assign source code words where the corresponding first set of code symbols addresses the same subset, to target code words of said subset such that an amount of the target code words of said subset said source code words are assigned to, having their remaining portions identical to the corresponding remaining portions of the target code words of their neighboring subsets corresponds to an optimization criterion.

The computer readable storage medium has stored therein instructions which, when executed by a computer, cause the computer to perform steps of the described method.

The source code words have a first predefined length, i.e. consist of a first predefined amount of code symbols. The target code words have a second predefined length, i.e. consist of a second predefined amount of code symbols.

In an embodiment the target code words comprise sequences of quaternary code symbols. The source code words may comprise sequences of binary code symbols. The usage of quaternary code symbols for target code words allows a direct correspondence or mapping of used symbols to DNA or RNA nucleotides or nucleobases and enables a more efficient coding than, for example, a mapping of binary symbols 0 and 1 to two respective of the four different nucleotides.

A neighboring subset possesses a nonzero Hamming distance to the corresponding subset. As an example, the predetermined amount of code symbols can be equal to 1, i.e. code words of neighboring subsets differ from the corresponding subset by one symbol within the identifying portion. The neighboring subsets are determined for each subset of the plurality of subsets.

In an embodiment the term "corresponds to an optimization criterion", i.e. satisfies an optimization criterion, refers to a feature that the amount of the target code words of said subset having their remaining portions identical to the corresponding remaining portions of the target code words of their neighboring subsets is maximized. A maximized amount of target code words refers to the maximum possible amount of target code words of a subset, having their remaining portions identical to the corresponding remaining portions of the target code words of their neighboring subset. In another embodiment the term "corresponds to an optimization criterion" refers to the feature that said amount of target code words is adapted to be a number close to but below the maximum possible amount, e.g. 1 below the maximum possible amount.

The term "portion" of a code word does not necessarily imply that the code symbols belonging to that portion form a sequence of consecutive symbols within the code word. For example, the remaining portion may embed the identifying portion or vice versa, code symbols at several defined positions may belong to the identifying portion, while the remaining symbols belong to the remaining portion etc.

The solution according to the aspect of the present principles provides a code book generation scheme to be used for generating code word sequences suitable for synthesizing nucleic acid molecules containing corresponding sequences of nucleotides. The encoding of source code words carrying data or information units is done by concatenating corresponding target code words to generate code word sequences suitable for synthesizing oligos. The coding scheme is applicable to arranging information units suitably to be stored in nucleic acid fragments while being decodable at a reduced error probability.

The provided solution at least has the effect that the target code words being subject to single or up to the predetermined amount of symbol errors within the identifying portion will be decoded correctly. Hence, information encoded in nucleic acid strands or oligos synthesized using sequences of the created target code words being subject to distortion will have an increased probability of correct decoding. The reliability of the sequencing of the oligos is improved, allowing provision of a reliable system for storing information in nucleic acid molecules, for example for archiving purposes.

In one embodiment target code words are removed from the plurality of target code words according to a decoding related criterion before grouping the plurality of target code words into a plurality of subsets of the target code words. Here, the term "according to a decoding related criterion" refers to a dependency of the decoding or decoding accuracy on the structure of the target code words to be decoded, i.e. on the actual sequence of consecutive symbols within a target code word or a sequence of target code words. For example, if the target code words serve as a basis for storing data in synthesized oligos, the performance accuracy of the bio-chemical processes of synthesizing, amplifying and sequencing may differ depending on the particular sequence of nucleotides within an oligo generated or to be generated, respectively. Other parameters may influence performance accuracy as well, for example a presence of other molecules or physical parameters such as, for example, temperature, pressure etc. In the described embodiment potential target code words which exhibit a higher probability of causing decoding errors are removed for increased probability of correct decoding.

A decoding related criterion may, for example, be a run length of code symbols, i.e. the number of consecutive identical code symbols within a target code word or a sequence of target code words or, respectively, consecutive identical nucleotides within an oligo or a sequence of oligos. For example, the run lengths for an oligo AATTTGCC are 2, 3, 1, 2 for A, T, G, C, respectively.

As an example, according to the decoding related criterion, target code words that comprise a run length of identical code symbols of more than a predefined maximum run length are removed. This reduces a probability of decoding errors caused by run length problems. For example, the predefined maximum run length can be 3, as experimental results have shown that 4 or more nucleotide repetitions, such as "AAAA" or "TTTTT" should be avoided in order to achieve more reliable sequencing results.

Further, target code words that comprise a run length of identical code symbols of more than the predefined maximum run length when being concatenated with another of the target code words are removed. This allows to avoid run lengths of identical target code symbols occurring when sequences of two or more code words are concatenated, for example in order to create a code word sequence suitable to generate a synthesized oligo from. Thereby, the probability of decoding errors caused by run length problems is further reduced.

The removal of target code words in view of run length constraints increases suitability of code word sequences generated from the (remaining) target code words for synthesizing a corresponding oligo, as longer run lengths, e.g. exceeding 3, in synthesized oligos or nucleic acid fragments can be less suitable for correct sequencing.

Without the removal of target code words, e.g. due to the run length constraint, each symbol of a target code word can represent two information bits or binary symbols of a source code word. A possible coding taking into account run length constraints can be based on assigning two different target code symbols to each source code symbol. For example, for source code symbols "0" and "1" and target code symbols "A", "T", "G" and "C", assigning "A" and "C" to "0", and "G and "T" to "1", and replacing a target code symbol by its counterpart in case a run length of target code symbols exceeds the allowed predefined maximum run length can be used to avoid run lengths exceeding the predefined maximum run length. However, here each target symbol can only represent one source code symbol.

According to the embodiment described above, even under the run length constraint, the capacity for run length constrained sequences is higher than 1. In this context, "capacity" refers to how many bits of a source code word can be represented by one symbol of a target code word asymptotically. The capacity C of an M-level run length limited modulation code where run lengths after modulation are limited in the range [d, k], where M is the alphabet size of modulation and d and k denote the minimum and maximum run length, respectively, is given by $C=\log_2 \gamma$, where $\gamma$ is the largest real root of the following characteristic equation: $z^{k+1}-z^k-(M-1)z^{k-d+1}+(M-1)=0$. Accordingly, the run length constraint of avoiding run lengths exceeding 3 on the modulation for DNA storage can be interpreted as to design a quaternary, run length limited code subject to d=1 and k=3. The corresponding capacity can be determined as $C \approx 1.9957$ bits/symbol, i.e., each symbol (nucleotide) can asymptotically represent 1.9957 information bits. In the context of data storage, a modulation with high modulation efficiency R/C, with code rate R bits/symbol, is desired, as the storage density increases with the modulation efficiency.

In one embodiment the determining step, i.e. the determining for the subsets one or more corresponding neighboring subsets within the plurality of subsets of the target code words, comprises or is carried out such that the identifying portions of the one or more neighboring subsets differ from the corresponding subset by selected symbol flips corresponding to dominant sequencing errors based on a sequencing error probability of nucleotides within nucleic acid strands. The amount of neighboring subsets for a specific subset is limited by only taking into account dominant symbol errors for the flipping. This additional constraint causes the neighboring subsets to be selected such that precisely for the particular subset/neighboring subset pairs the amount of common assignments is maximized, i.e. the amount of target code words is maximized which differ between the subset and its neighboring subset only by up to said predefined amount of code symbols, e.g. one code symbol, within the identifying portion. When using the generated target code words for synthesizing nucleic acid strands, such as DNA strands, certain symbol flips where a symbol is decoded that differs from the initially encoded symbol, can be dominant, i.e. occur more likely than others. For example, the dominant single symbol errors in DNA storage are the symbol transitions between A and G, and between C and T. By maximizing the amount of common assignments between two neighboring subsets the influence on the decodability of the source code words, more precisely on the first set of source code symbols for assigning source code words to subsets of target code words, due to dominant single symbol errors within the identifying portion of the target code symbols is minimized or at least reduced. This significantly reduces the remaining error rate.

In one embodiment the pluralities of source code words and target code words are divided into source code words and target code words of a first code and of a second code, the target code words of the first code and of the second code both having the properties that the reverse complementary word of a target code word of the corresponding code still belongs to the corresponding code, and that there is no common code word between the first code and the second code, and that a target code word of the second code is neither equal to any portion of two cascaded target code words of the first code nor equal to any portion of cascaded one target code word of the first code and one target code word of the second code, and wherein the grouping, selecting, determining and assigning is applied to the first code. In another embodiment the second code instead of or in addition to the first code may be subject to the grouping, selecting, determining and assigning. In order to avoid self-reverse complementarity and, thereby, increase correctness of decoding, code word sequences are generated by multiplexing code words of the first and the second code. This allows, for example, generation of non-self-reverse complementary nucleic acid oligos to be synthesized being composed of multiplexed code words from the first and the second code.

If the first code is generated according to the embodiment described above, the second code may serve as provider of suitable delimiting code words to avoid self-reverse complementarity. In one embodiment, for increased coding efficiency by employing the second code for additional information transmission at reduced error probability, the used second code can be generated according to the following: The plurality of target code words of the second code is grouped into a plurality of subsets of the target code words of the second code, the target code words of the second code comprising an identifying portion and a remaining portion, wherein the identifying portions of the target code words of the second code which correspond to a same subset of the plurality of subsets of target code words of the second code are identical. A first set of code symbols of the source code words of the second code is selected for addressing the plurality of subsets of target code words of the second code. Then source code words of the second code where the corresponding first set of code symbols addresses the same subset of target code words of the second code are assigned to said subset according to a cost function minimizing a Hamming distance between the remaining portions of the target code words of the second code.

For example, the identifying portions of the target code words of the second code can be embedded between two parts of the corresponding remaining portions. Further, the source code words may, for example, be binary code words of a first predefined length and the target code words may, for example, be quaternary code words of a second predefined length.

As an example, the cost function minimizing the Hamming distance between the remaining portions of the target code words of the second code may depend on a symbol error probability. According to this example embodiment, the cost function does not treat each possible error equally, but takes into account that, depending on the application, certain symbol errors may occur more likely than others. This allows adaptation of the coding scheme to specific error constraints of the targeted application.

As an example, the symbol error probability is based on a sequencing error probability of nucleotides within nucleic acid strands. This allows adaptation of the coding scheme to the specific constraints of nucleic acid storage systems such as DNA or RNA storage systems.

In one embodiment, at least one code word sequence from one or more of the target code words is generated; and at least one nucleic acid molecule comprising a segment wherein a sequence of nucleotides is arranged to correspond to the at least one code word sequence is synthesized. A nucleic acid molecule may, for example, be a DNA fragment or an RNA fragment generated by a synthesizer device which receives sequences of the generated code words. In other words, DNA or RNA oligos are synthesized according to sequences of the generated code words. The synthesized oligos carry the information encoded by the succession of the nucleotides forming the oligos. These molecules can be stored and the information can be retrieved by reading the sequence of nucleotides using a sequencer and decoding the extracted code words.

For example, for the embodiment making use of two different codes, oligos are synthesized from at least one code word sequence which is generated from one or more of the target code words, wherein after a predefined amount of first code words at least one second code word is inserted. The oligo contains a segment wherein a sequence of nucleotides is arranged to correspond to the code word sequence. Many more than one nucleic acid molecule may be generated.

The amount of nucleic acid molecules or oligos generated or synthesized by a synthesizer corresponds to the amount of generated code word sequences. At least one nucleic acid molecule is synthesized for each code word sequence. However, multiple oligos may be generated for each or a selected, for example high-priority, subset of the code word sequences. The synthesizing step may, for example, be carried out after generation of all code word sequences or after generation of each of the sequences.

Further, in an embodiment the apparatus or device which is configured to carry out the method described above is comprised in a nucleic acid storage system, such as a DNA storage system or an RNA storage system. For example, the nucleic acid storage system further comprises a nucleic acid storage unit or container and a sequencer unit or device configured to sequence the synthesized and stored nucleic acid molecules to retrieve and decode the encoded code word sequence.

While not explicitly described, the present embodiments may be employed in any combination or sub-combination.

DETAILED DESCRIPTION OF EMBODIMENTS

For a better understanding, the present principles will now be explained in more detail in the following description with reference to the drawings. It is understood that the present principles are not limited to these exemplary embodiments and that specified features can also expediently be combined and/or modified without departing from the scope of the present principles as defined in the appended claims.

Figure 1:
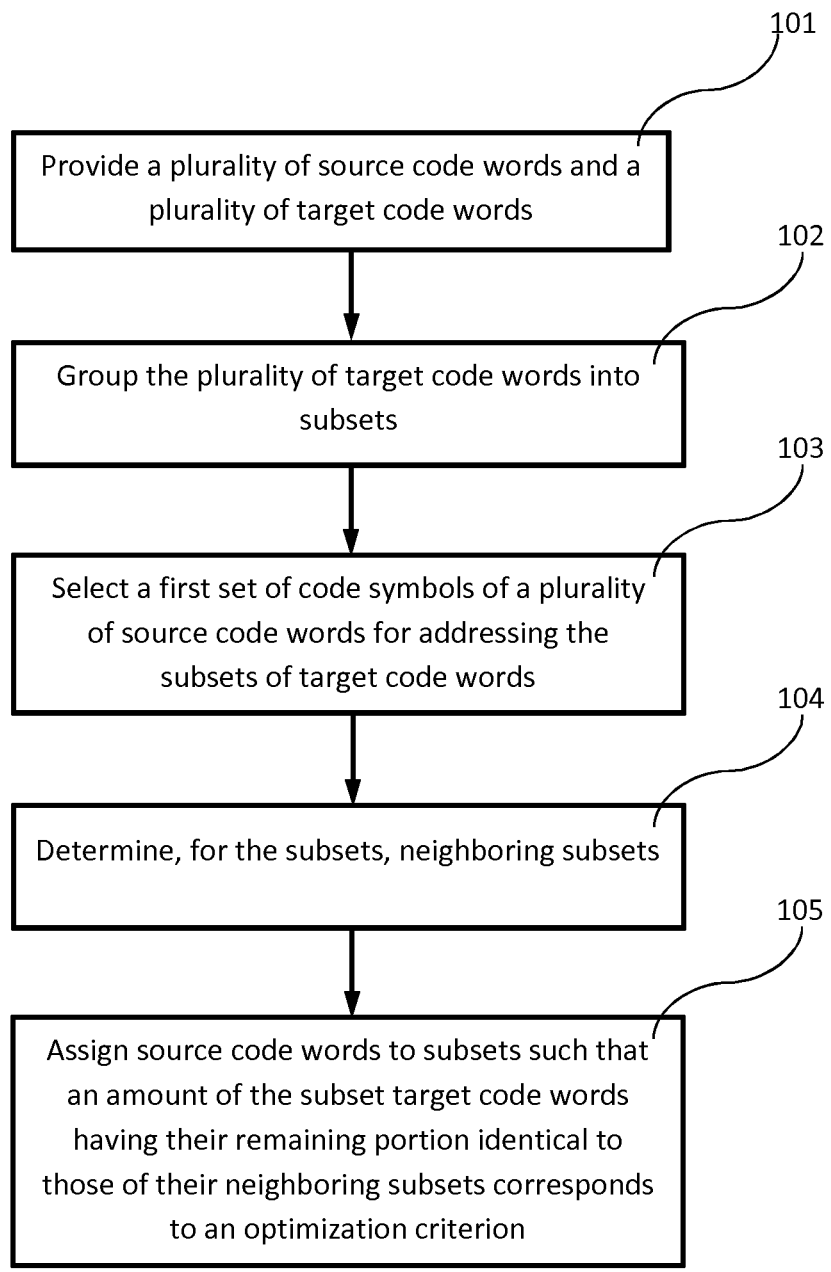
FIG. 1 schematically illustrates an embodiment of a code book generation method for mapping a plurality of source code words to a plurality of target code words.

Referring to FIG. 1, an embodiment of a code book generation method 100 for mapping a plurality of source code words to a plurality of target code words is schematically shown. The term "code word" refers to a sequence of code symbols such as binary or quaternary code symbols. "source code words" are used to provide pieces of information, e.g. binary encoded bitstreams, whereas "target code words" are modulated sequences of code symbols used to carry the pieces of information in a transcoded format suitable for generating synthesized oligos from.

In a first step 101 a plurality of source code words and a plurality of target code words are provided. In another embodiment these initial pluralities of source and target code words may already be available.

In a second step 102 the plurality of target code words is grouped into a plurality of subsets of the target code words. The target code words comprise an identifying portion and a remaining portion, wherein the identifying portions of the target code words corresponding to a same subset of the plurality of subsets are identical. In other words, each target code word of a subset is identified by the same identifier wherein the identifier comprised in the identifying portion may be represented by a single or multiple code symbols being either consecutive or distributed across the code word.

In a third step 103 a first set of code symbols of the source code words is selected for addressing the plurality of subsets. The first set of code symbols corresponds to an identifying portion of the source code words.

In a fourth step 104 for the subsets one or more corresponding neighboring subsets within the plurality of subsets are determined. The identifying portions of the target code words of the one or more neighboring subsets differ from the identifying portion of the target code words of the corresponding subset by up to a predetermined amount of code symbols, for example one code symbol.

In a fifth step 105 source code words where the corresponding first set of code symbols addresses the same subset are assigned to the subset, i.e. said same subset, such that an amount of the target code words of the subset which have their remaining portions identical to the corresponding remaining portions of the target code words of their neighboring subsets corresponds to an optimization criterion.

Figure 2:
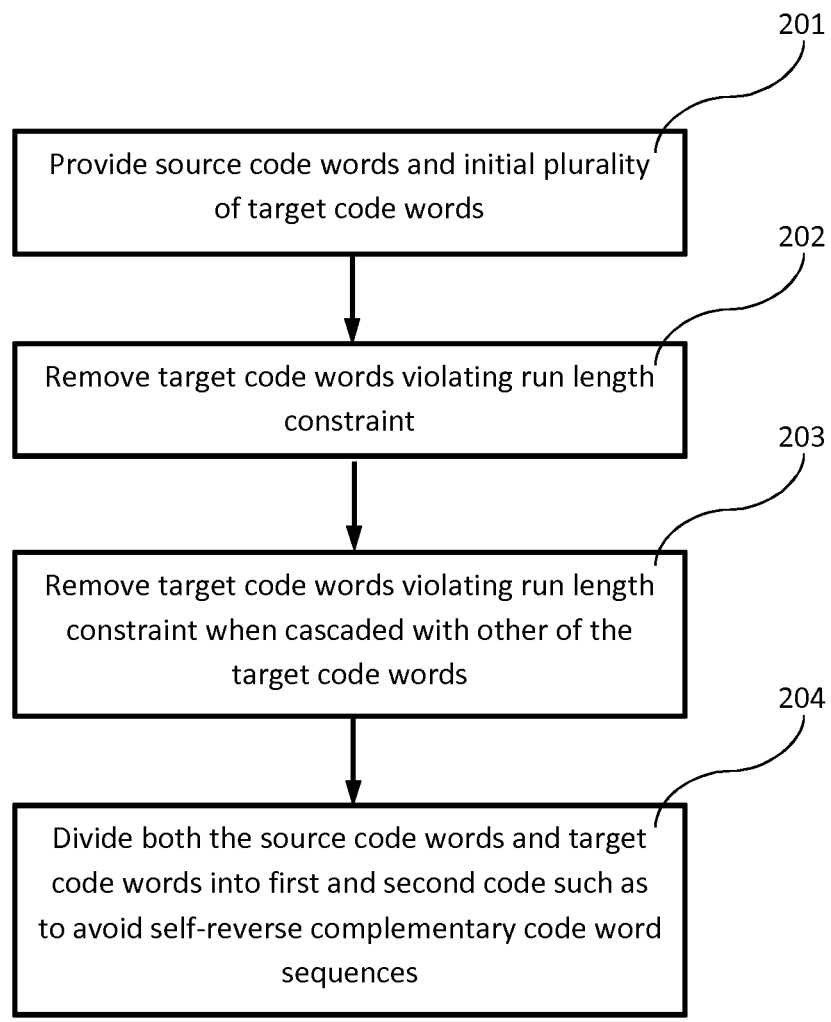
FIG. 2 schematically illustrates steps of an embodiment of a code book generation method for mapping a plurality of source code words to a plurality of target code words.

Additionally referring to FIG. 2, an embodiment of steps of a code book generation method for mapping a plurality of source code words to a plurality of target code words is schematically shown. The shown steps refer to an example of an embodiment of the step 101 of providing source and target code words according to the method shown in FIG. 1. Here, the provision comprises target code words being preselected according to run length constraints and the pluralities of source and target code words being divided into a first and a second code.

In a step 201 the source code words and an initial plurality of target code words are provided.

In a next step 202 target code words are removed from the plurality of target code words, i.e. the initial plurality of target code words, according to a decoding related criterion before grouping the plurality of target code words into a plurality of subsets of the target code words, wherein according to the decoding related criterion target code words that comprise a run length of identical code symbols of more than a predefined maximum run length are removed. In an example embodiment, this predefined maximum run length is set to three code symbols. In other embodiments, the predefined maximum run length can be set to, for example, two, four, or other values.

In a next step 203 target code words that comprise a run length of identical code symbols of more than the predefined maximum run length when being concatenated with another of the target code words are removed. This eliminates all target code words that fail to meet the run length constraint, either alone or in combination with another of the target code words. Therefore, sequences of multiple target code words will meet the run length constraint.

In another step 204 both the source code words and target code words are divided into a first and a second code suitable to avoid self-reverse complementary code word sequences. The pluralities of source code words and target code words are divided into source code words and target code words of a first code and of a second code both having the properties that the reverse complementary code word of a target code word of the corresponding code still belongs to the corresponding code and that there is no common code word between the first code and the second code. The steps of grouping 102, selecting 103, determining 104 and assigning 105 as shown in FIG. 1 are carried out for the first code. In another embodiment these steps can be applied, additionally or instead, to the second code.

Figure 3:
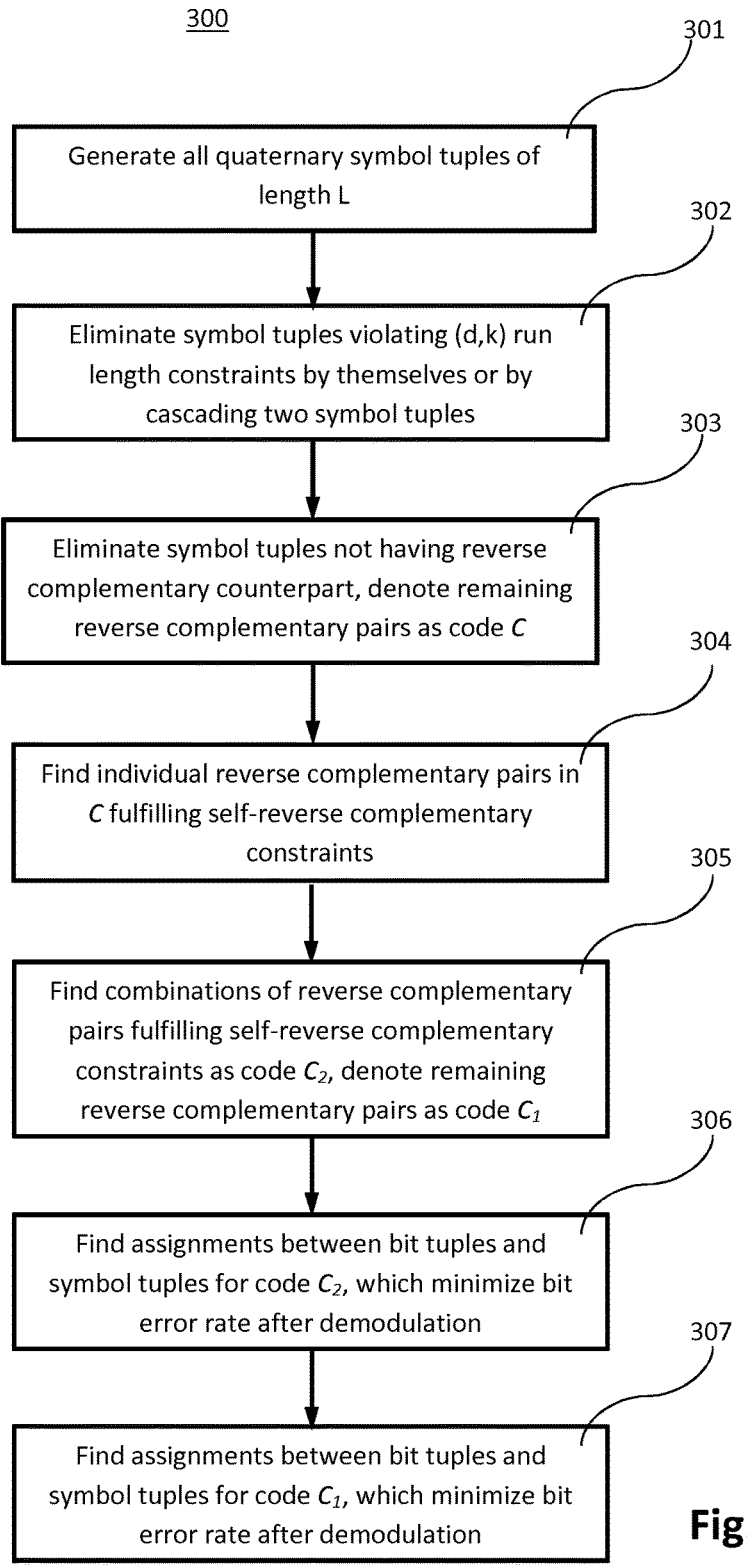
FIG. 3 schematically illustrates another embodiment of a code book generation method for mapping a plurality of source code words to a plurality of target code words.

Referring to FIG. 3, another embodiment of a code book generation method 300 for mapping a plurality of source code words to a plurality of target code words is schematically shown. Without limitation of generality, target code words consist of quaternary code symbols A, T, C, G corresponding to DNA nucleobases and are represented by integers 0, 1, 2, 3, respectively, whereas source code words consist of binary code symbols represented by integers 0 and 1.

In the shown embodiment, in a first step 301 all quaternary target code words, i.e. all quaternary symbol tuples, of a predefined length L are generated. The term "tuple" is used to refer to an ordered list of elements, such as a sequence of code symbols.

In a second step 302 all symbol tuples violating the (d, k) run length constraint by themselves or by cascading two symbol tuples are eliminated from the set of target code words, i.e. from the generated quaternary symbol tuples. The run length limitation is set by lower limit d and upper limit k, for example with parameters d=1 and k=3. With this example parameters, run lengths will be limited from 1 to 3 after modulation. Any modulation fulfilling the run length constraints has a code rate less than the capacity of about 1.9975 bits/symbol. As an example, the modulation code is generated by mapping bit tuples, i.e. binary source code words, of length 9 to (target) symbol tuples, i.e. target code words, of length 5. Other lengths may be chosen instead. For the chosen example parameters, the corresponding code rate is 1.8 bits/symbol.

For illustration of the shown embodiment, bit tuples of source code words are denoted as $(u_1, u_2, u_3, u_4, u_5, u_6, u_7, u_8, u_9)$ and quaternary symbol tuples of target code words are denoted as $(x_1, x_2, x_3, x_4, x_5)$, before and after modulation, where $u_i \in \{0, 1\}$, $1 \leq i \leq 9$ and $x_i \in \{0, 1, 2, 3\}$, $1 \leq i \leq 5$.

For example, for the above-mentioned chosen parameters, steps 301 and 302 are performed as follows to fulfill the run length constraints: According to step 301, all 1024 quaternary target symbol tuples of length 5 from (0, 0, 0, 0, 0) to (3, 3, 3, 3, 3) are constructed. According to step 302, target symbol tuples obtained in step 301, which begin or end with two same symbols are eliminated. In other words, target symbol tuples with $x_1 \neq x_2$ and $x_4 \neq x_5$ are maintained, so that concatenating two target symbol tuples still fulfills run length constraints d=1, k=3.

In a next step 303, if necessary, target symbol tuples not having reverse complementary counterparts are eliminated. The remaining reverse complementary pairs of target symbol tuples, i.e. target code words, are denoted as code C.

With the chosen example parameters as described above, the resulting set of target symbol tuples automatically only contains target symbol tuples with reverse complementary counterparts.

In a next step 304 individual reverse complementary pairs of target code symbol tuples, i.e. target code words, are found in C which fulfill self-reverse complementary constraints (i) and (ii) below as a prerequisite for enabling generation of non-self-reverse complementary target code word sequences. The resulting set has 576 target code words (length-5 target symbol tuples belonging to C). These target symbol tuples, i.e. target code words, exhibit at least the following properties: (i) they are not self-reverse complementary; and (ii) the self-reverse complementary counterpart of any code word is also one code word within C. In other words, $X \in C$, and $\overline{X}$ denote a code word and its reverse complementary counterpart, respectively, wherein $X \neq \overline{X}$, and $\overline{X} \in C$. In this context, X and $\overline{X}$ are called a reverse complementary pair. In other words, code C is composed of reverse complementary pairs. In the example, there are 288 reverse complementary pairs in C.

In a next step 305 combinations of reverse complementary pairs of target code words fulfilling the self-reverse complementary constraints are found and selected as code $C_2$. Remaining reverse complementary pairs are denoted as code $C_1$. In more details, to avoid self-reverse complementarity of target code words sequences, code C is divided into two subsets, denoted as code $C_1$ and $C_2$. DNA fragments to be synthesized are composed by multiplexing code words from $C_1$ and $C_2$.

As an example, the construction of code $C_1$ and $C_2$ according to step 305 can be performed in two phases:

In a first phase, a reverse complementary pair comprised in code C, denoted as $Y=(y_1, y_2, y_3, y_4, y_5)$ and $\overline{Y}=(\overline{y}_1, \overline{y}_2, \overline{y}_3, \overline{y}_4, \overline{y}_5)$, is selected to construct code $C_2$, and remaining 287 reverse complementary pairs are selected to belong to $C_1$. For example, $Y=(0, 2, 0, 1, 0)$ and $\overline{Y}=(1, 0, 1, 3, 1)$ may be selected to construct $C_2$. Other selections are possible. Only one code word of the reverse complementary pair from $C_2$, for example Y, is used to be multiplexed with code words from $C_1$ to generate sequences suitable for synthesizing DNA fragments, while all code words from $C_1$ can be chosen for multiplexing. Using only Y (while $\overline{Y}$ is not used) for multiplexing ensures that for a DNA fragment its reverse complementary counterpart only includes $\overline{Y}$. Otherwise, a DNA fragment cannot be guaranteed to be self-reverse complementary for some arrangements.

For explanation purposes, a contradicted example is given using both Y and $\overline{Y}$ for multiplexing. A sequence potentially suitable for a DNA fragment is constructed as $S=[X_1, X_2, Y, X_3, \overline{X}_3, \overline{Y}, \overline{X}_2, \overline{X}_1]$, and its reverse complementary counterpart is given by $\overline{S}=[X_1, X_2, Y, X_3, \overline{X}_3, \overline{Y}, \overline{X}_2, \overline{X}_1]=S$ indicating that the originally constructed DNA fragment is self-reverse complementary. On the other hand, if only Y was used for S, Y will never appear in $\overline{S}$.

For example, $(x_1, x_2, x_3, x_4, x_5)$ and $(x_1', x_2', x_3', x_4', x_5')$ denote two target code words from $C_1$. These code words can but do not have to be different. Since $C_1$ and $C_2$ are exclusive, i.e. there is no common code word belonging to $C_1$ and also to $C_2$, no target code word of $C_1$ is equal to Y. If neither any combination of two code words from $C_1$ nor any combination of one code word from $C_1$ and $\overline{Y}$ is equal to Y, any DNA fragment including Y will not be self-reverse complementary.

Specifically, it is checked whether Y is not equal to any one of the following combinations: $(x_5, x_1', x_2', x_3', x_4')$, $(x_4, x_5, x_1', x_2', x_3')$, $(x_3, x_4, x_5, x_1', x_2')$, $(x_2, x_3, x_4, x_5, x_1')$, $(x_5, \overline{y}_1, \overline{y}_2, \overline{y}_3, \overline{y}_4)$, $(x_4, x_5, \overline{y}_1, \overline{y}_2, \overline{y}_3)$, $(x_3, x_4, x_5, \overline{y}_1, \overline{y}_2)$, $(x_2, x_3, x_4, x_5, \overline{y}_1)$, $(\overline{y}_2, \overline{y}_3, \overline{y}_4, \overline{y}_5, x_1)$, $(\overline{y}_3, \overline{y}_4, \overline{y}_5, x_1, x_2)$, $(\overline{y}_4, \overline{y}_5, x_1, x_2, x_3)$, $(\overline{y}_5, x_1, x_2, x_3, x_4)$. If Y is not equal to any of these combinations and a code word sequence includes Y, Y will not appear at any position of the reverse complementary counterpart of the code word sequence, making it suitable for synthesizing a corresponding DNA fragment.

For the concrete example as described above, a total of 18 reverse complementary pairs can be used to construct $C_2$: {(0, 1, 1, 1, 0), (1, 0, 0, 0, 1)}, {(2, 1, 1, 1, 0), (1, 0, 0, 0, 3)}, {(3, 1, 1, 1, 0), (1, 0, 0, 0, 2)}, {(0, 2, 2, 2, 0), (1, 3, 3, 3, 1)}, {(1, 2, 2, 2, 0), (1, 3, 3, 3, 0)}, {(3, 2, 2, 2, 0), (1, 3, 3, 3, 2)}, {(0, 3, 3, 3, 0), (1, 2, 2, 2, 1)}, {(2, 3, 3, 3, 0), (1, 2, 2, 2, 3)}, {(2, 0, 0, 0, 1), (0, 1, 1, 1, 3)}, {(3, 0, 0, 0, 1), (0, 1, 1, 1, 2)}, {(0, 2, 2, 2, 1), (0, 3, 3, 3, 1)}, {(3, 2, 2, 2, 1), (0, 3, 3, 3, 2)}, {(2, 3, 3, 3, 1), (0, 2, 2, 2, 3)}, {(2, 0, 0, 0, 2), (3, 1, 1, 1, 3)}, {(3, 0, 0, 0, 2), (3, 1, 1, 1, 2)}, {(2, 1, 1, 1, 2), (3, 0, 0, 0, 3)}, {(2, 3, 3, 3, 2), (3, 2, 2, 2, 3)}, {(2, 0, 0, 0, 3), (2, 1, 1, 1, 3)}.

The pairs can be found by checking all possible divisions of C into $C_1$ and $C_2$.

If only one pair is used to construct $C_2$, and therefore only one code word Y is used to construct sequences for synthesizing DNA fragments by multiplexing code words from $C_1$ and Y, code $C_2$ is used solely to avoid self-reverse complementarity. If more reverse complementary pairs are used to construct $C_2$, code $C_2$ can also be used to encode and transmit information in addition to avoiding self-reverse complementarity.

Setting forth the example given above, in a second phase, 16 reverse complementary pairs are selected from the obtained 18 pairs to construct $C_2$, and the remaining 272 complementary pairs are selected to construct $C_1$. As a result of the first phase, any code word in $C_2$ is not equal to any combination of two code words from $C_1$. For example, ($x_1$, $x_2$, $x_3$, $x_4$, $x_5$) and $Y=(y_1, y_2, y_3, y_4, y_5)$ are code words from $C_1$ and $C_2$, respectively. It is checked whether Y is not equal to any one of the following combinations: ($x_5$, $y_1'$, $y_2'$, $y_3'$, $y_4'$), ($x_4$, $x_5$, $y_1'$, $y_2'$, $y_3'$), ($x_3$, $x_4$, $x_5$, $y_1'$, $y_2'$), ($x_2$, $x_3$, $x_4$, $x_5$, $y_1'$), ($y_2'$, $y_3'$, $y_4'$, $y_5'$, $x_1$), ($y_3'$, $y_4'$, $y_5'$, $x_1$, $x_2$), ($y_4'$, $y_5'$, $x_1$, $x_2$, $x_3$), ($y_5'$, $x_1$, $x_2$, $x_3$, $x_4$), where $Y'=(y_1', y_2', y_3', y_4', y_5')$ denotes a code word from $C_2$.

Again, only one code word from each reverse complementary pair in $C_2$ is used to be multiplexed to construct sequences for generating DNA fragments, while there is no limitation to choose code words from $C_1$ for multiplexing.

If all 32 code words (corresponding to 16 code word pairs) from $C_2$ pass the check, they can be used to store 4 bits of information, as only one code word from each reverse complementary pair in $C_2$ is used to be multiplexed, in addition to be used to avoid self-reverse complementarity in conjunction with code words from $C_1$.

If not all 32 code words pass the check, 8 reverse complementary pairs are used to construct $C_2$, and the above check is carried out again. If in this case the check is passed, 3 bits information can be stored using $C_2$. This procedure is continued until a set of reverse complementary pairs can be found to pass the check.

Setting forth the example above, any combination of 16 reverse complementary pairs from 18 pairs passes the check. Therefore, any combination of 16 reverse complementary pairs can be used as $C_2$. Without limitation of generality, the following 16 reverse complementary pairs are used:
{(0, 1, 1, 1, 0), (1, 0, 0, 0, 1)}, {(2, 1, 1, 1, 0), (1, 0, 0, 0, 3)}, {(3, 1, 1, 1, 0), (1, 0, 0, 0, 2)}, {(0, 2, 2, 2, 0), (1, 3, 3, 3, 1)}, {(1, 2, 2, 2, 0), (1, 3, 3, 3, 0)}, {(3, 2, 2, 2, 0), (1, 3, 3, 3, 2)}, {(0, 3, 3, 3, 0), (1, 2, 2, 2, 1)}, {(2, 3, 3, 3, 0), (1, 2, 2, 2, 3)}, {(2, 0, 0, 0, 1), (0, 1, 1, 1, 3)}, {(3, 0, 0, 0, 1), (0, 1, 1, 1, 2)}, {(0, 2, 2, 2, 1), (0, 3, 3, 3, 1)}, {(3, 2, 2, 2, 1), (0, 3, 3, 3, 2)}, {(2, 3, 3, 3, 1), (0, 2, 2, 2, 3)}, {(2, 0, 0, 0, 2), (3, 1, 1, 1, 3)}, {(3, 0, 0, 0, 2), (3, 1, 1, 1, 2)}, {(2, 1, 1, 1, 2), (3, 0, 0, 0, 3)}.

Consequently, $C_2$ can be used to store 4 bits per code word, and there are 544 code words in $C_1$, enabling storage of 9 bits per code word. If one code word from $C_2$ is inserted after every $n_s$ code words from $C_1$, every $5(n_s+1)$ quaternary symbols can store $4+9n_s$ information bits, i.e., the code rate is calculated by $$\frac{4+9n_s}{5(n_s+1)}.$$

For example, for $n_s=10$, the code rate is about 1.709 bits/symbol.

Still referring to FIG. 3, in a next step 306 assignments between bit tuples, i.e. source code words, and symbol tuples, i.e. target code words, for code $C_2$ are found, which minimize a bit error rate after demodulation.

Setting forth the example given above, one code word from each reverse complementary pair in $C_2$ is used to store 4 bits of information. Without limitation of generality, the following target code words can be selected:
{(0, 1, 1, 1, 0), (2, 1, 1, 1, 0), (3, 1, 1, 1, 0), (0, 2, 2, 2, 0), (1, 2, 2, 2, 0), (1, 3, 3, 3, 2), (0, 3, 3, 3, 0), (2, 3, 3, 3, 0), (2, 0, 0, 0, 1), (3, 0, 0, 0, 1), (0, 2, 2, 2, 1), (3, 2, 2, 2, 1), (2, 3, 3, 3, 1), (2, 0, 0, 0, 2), (3, 0, 0, 0, 2), (2, 1, 1, 1, 2)}.

One common property of these code words is that for fixed middle 3-symbol tuples there are 4 code words, and there are four different middle 3-symbol tuples. Therefore, above target code words can be divided into four subsets according to the middle 3-symbol tuple. Two information bits can be mapped to the middle 3-symbol tuple, and the other two information bits can be assigned dependent on the begin/end symbols of the code words.

For example, for ($u_1$, $u_2$, $u_3$, $u_4$) being an information tuple, i.e. a source code word, to be mapped to a code word in $C_2$, the first two bits can be mapped to the middle 3-symbols according to Table A:

TABLE A

| $u_1, u_2$ | $x_2, x_3, x_4$ |
|---|---|
| 0, 0 | 0, 0, 0 |
| 0, 1 | 1, 1, 1 |
| 1, 0 | 2, 2, 2 |
| 1, 1 | 3, 3, 3 |

For demodulation, i.e. the decision from a sequenced 3-symbol tuple to a 2-bit tuple, the Hamming distance, i.e. the number of different symbols between two symbol tuples, can be used as a decision criterion. The symbol tuple in the above lookup table with the minimum Hamming distance to the sequenced symbol tuple will be decided. Therefore, one single symbol error, causing one synthesized symbol being sequenced to a different symbol than the correct one, does not cause any bit error. For example, a bit tuple 0, 0 is modulated to a symbol tuple 0, 0, 0, which will be used for synthesizing. If one symbol error occurs after sequencing, and incorrect symbol tuple, for example 1, 0, 0 will be sequenced, but after calculating Hamming distances between symbol tuples in the lookup table, the symbol tuple 0, 0, 0 will be decided to be the correct one, resulting in no bit error.

Further, $u_3$, $u_4$ are mapped to target symbols $x_1$, $x_5$ such as to minimize the bit error rate. For example, for the case $x_2$, $x_3$, $x_4=0,0,0$, $x_1$, $x_5 \in \{(2,1), (3,1), (2,2), (3,2)\}$ there are a total of $4 \cdot 3 \cdot 2 \cdot 1=24$ possible mappings from $u_3$, $u_4$ to $x_1$, $x_5$. Due to single symbol errors a two-symbol tuple $(x_1, x_5) \in \{(2,1), (3,1), (2,2), (3,2)\}$ may be changed to be another tuple $(x_1', x_5') \in \{(2,1), (3,1), (2,2), (3,2)\}$. For example, $(x_1, x_5)=(2,1)$ is changed to $(x_1', x_5')=(3,1)$, denoted as $(x_1, x_5) \rightarrow (x_1', x_5')$. By listing all cases of such single symbol errors, the total number of resulting bit errors can be evaluated as $$J=\Sigma_{(x_1,x_5) \rightarrow (x_1',x_5')} d_H((u_3,u_4),(u_3',u_4')) \quad \text{(eq.1)}$$

where $d_H(u_3, u_4), (u_3', u_4'))$ denotes the Hamming distance between ($u_3$, $u_4$) and ($u_3'$, $u_4'$), and ($u_3$, $u_4$) and ($u_3'$, $u_4'$) are mapped to ($x_1$, $x_5$) and ($x_1'$, $x_5'$) for a specific mapping. All possible 24 mappings are tested according to the cost function given in (eq.1). And the mapping minimizing (eq.1) is selected as an appropriate mapping between ($u_3$, $u_4$) and ($x_1$, $x_5$). One such mapping is shown in Table B:

TABLE B

| $u_3, u_4$ | $x_1, x_5$ |
|---|---|
| 0, 0 | 2, 1 |
| 0, 1 | 3, 1 |
| 1, 0 | 2, 2 |
| 1, 1 | 3, 2 |

Consequently, the mapping between ($u_1$, $u_2$, $u_3$, $u_4$) and ($x_1$, $x_2$, $x_3$, $x_4$, $x_5$) for a fixed middle 3-symbol $x_2$, $x_3$, $x_4$=0,0,0 is shown in Table C:

TABLE C

| $u_1, u_2, u_3, u_4$ | $x_1, x_2, x_3, x_4, x_5$ |
|---|---|
| 0, 0, 0, 0 | 2, 0, 0, 0, 1 |
| 0, 0, 0, 1 | 3, 0, 0, 0, 1 |
| 0, 0, 1, 0 | 2, 0, 0, 0, 2 |
| 0, 0, 1, 1 | 3, 0, 0, 0, 2 |

Mappings for other fixed middle 3-symbol patterns can be determined accordingly. In summary, for the given example the modulation table for $C_2$ is obtained as shown in Table D:

TABLE D

| ($u_1, u_2, u_3, u_4$) | ($x_1, x_2, x_3, x_4, x_5$) |
|---|---|
| 0, 0, 0, 0 | 2, 0, 0, 0, 1 |
| 0, 0, 0, 1 | 3, 0, 0, 0, 1 |
| 0, 0, 1, 0 | 2, 0, 0, 0, 2 |
| 0, 0, 1, 1 | 3, 0, 0, 0, 2 |
| 0, 1, 0, 0 | 0, 1, 1, 1, 0 |
| 0, 1, 0, 1 | 2, 1, 1, 1, 0 |
| 0, 1, 1, 0 | 3, 1, 1, 1, 0 |
| 0, 1, 1, 1 | 2, 1, 1, 1, 2 |
| 1, 0, 0, 0 | 0, 2, 2, 2, 0 |
| 1, 0, 0, 1 | 1, 2, 2, 2, 0 |
| 1, 0, 1, 0 | 0, 2, 2, 2, 1 |
| 1, 0, 1, 1 | 3, 2, 2, 2, 1 |
| 1, 1, 0, 0 | 1, 3, 3, 3, 2 |
| 1, 1, 0, 1 | 0, 3, 3, 3, 0 |
| 1, 1, 1, 0 | 2, 3, 3, 3, 0 |
| 1, 1, 1, 1 | 2, 3, 3, 3, 1 |

If symbol error probabilities are available, the cost function (eq.1) can be modified as $$J = \Sigma_{(x_1,x_5) \to (x_1',x_5')} P\{(x_1,x_5) \to (x_1',x_5')\} d_H((u_3,u_4), (u_3',u_4'))$$ (eq.2)

As an example, $P\{(2,1) \to (3,1)\} = P\{2 \to 3\}$ is the probability that a symbol 2 (corresponding to nucleotide C) is synthesized, but a symbol 3 (corresponding to nucleotide G) is sequenced. If such symbol error probabilities are available, appropriate mapping can be found to minimize the cost function (eq.2).

Still referring to FIG. 3, in a next step 307 assignments between bit tuples, i.e. source code words, and symbol tuples, i.e. target code words, for code $C_1$ are found which minimize a bit error rate after demodulation. As mentioned before, according to the example given above there are 544 target code words in $C_1$. A mapping rule is determined to assign source code words ($u_1, u_2, u_3, u_4, u_5, u_6, u_7, u_8, u_9$) to target code words ($x_1, x_2, x_3, x_4, x_5$), such that the bit error rate after demodulation is minimized. At first, the code word portion $x_1, x_3, x_5$ is considered. It can be verified that for each of 64 different combinations for $x_1, x_3, x_5$, there are 8 or more code words in $C_1$. Therefore, $x_1, x_3, x_5$ can be assigned to 6 bits. Without limiting the generality, $u_1, u_2$ are mapped to $x_1$; $u_3, u_4$ are mapped to $x_3$; and $u_5, u_6$ are mapped to $x_5$. For example, one mapping can be defined as $$x_1 = u_1 + 2u_2, x_3 = u_3 + 2u_4, x_5 = u_5 + 2u_6.$$ (eq.3)

As another example, if symbol error probabilities are available, a different mapping other than (eq.3) resulting in less bit error probability can be employed. In other words, the following cost function can be used to find an appropriate mapping:

$$J_p = \Sigma_{x_1 \to x_1'} P\{x_1 \to x_1'\} d_H((u_1,u_2),(u_1',u_2'))$$ (eq.4)

Similar cost functions can be used for mapping between $u_3, u_4$ and $x_3$, and between $u_5, u_6$ and $x_5$.

According to $x_1, x_3, x_5$, $C_1$ is divided into 64 subsets, denoted as $S_1, S_2, \ldots, S_{64}$, where the index for $S_i$ is equal to $i = x_1 + 4x_3 + 16x_5 + 1$. For example, $S_1 = \{(01010), (02010), (03010), (01020), (02020), (03020), (01030), (02030), (03030)\}$, where $x_1 = x_3 = x_5 = 0$.

The target of assigning information bits, i.e. source code words, to symbols, i.e. target code words, while minimizing the bit error probability, is carried out on a subset basis. In this context, the concept of neighboring subsets is used. Since each subset is indexed by $x_1, x_3, x_5$ as the identifying portion of the target code word, a neighboring subset is obtained by flipping a predefined amount of symbols, for example one symbol, of $x_1, x_3, x_5$. In the shown embodiment the number of neighboring subsets for a specific subset is limited, as only dominant symbol errors are taken into account for the flipping. As an example, the dominant single symbol errors for synthesizing and sequencing DNA fragments are the symbol transitions between A and G, or between C and T, or equivalently, between 0 and 3 or between 2 and 1. Therefore, in the described example each subset has exactly three neighboring subsets. For example, $S_1$ has $x_1=0$, $x_3=0$, $x_5=0$, and its neighboring subsets will have $x_1=3$, $x_3=0$, $x_5=0$, or $x_1=0$, $x_3=3$, $x_5=0$, or $x_1=0$, $x_3=0$, $x_5=3$. Hence, neighboring subsets of $S_1$ are $S_4$, $S_{13}$, $S_{49}$.

Figure 4:
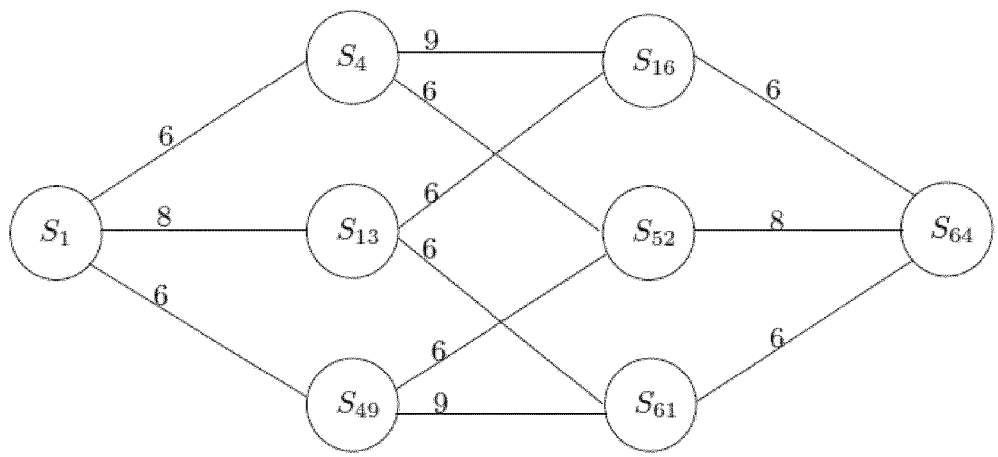
FIG. 4 schematically illustrates an example of a neighboring subset graph.

Additionally referring to FIG. 4, an example of a neighboring subset graph is schematically shown. The neighboring subset graph is obtained by connecting neighboring subsets, where the numbers on the branches between two neighboring subsets denote the number of common $x_2, x_4$ combinations between them.

As an example, $S_{13} = \{(01310), (02310), (03310), (01320), (02320), (03320), (01330), (02330)\}$, which has 8 common $x_2, x_4$ combinations with $S_1$, namely $\{11,21,31,12,22,32,13,23\}$. For the assignments of 3 bits $u_7, u_8, u_9$ to $x_2, x_4$, the number of common assignments between two neighboring subsets is maximized, so that the influence on $u_7, u_8, u_9$ due to dominant single symbol errors for $x_1, x_3, x_5$ is minimized. In other words, if the assignments of 3 bits $u_7, u_8, u_9$ to $x_2$, $x_4$ are given for $S_1$, the same assignments will be applied for $S_{13}$.

On the other hand, $S_4$ has only 6 common assignments with $S_1$. Therefore, further 2 assignments are needed for $S_4$, which can be found similarly according to (eq.1) or (eq.2) to minimize bit error probability after demodulation.

Setting forth the example above, a mapping for $S_1$ is determined in order to assign three bits to two symbols in the set $\{11,21,31,12,22,32,13,23\}$. A first example of a mapping is given in Table E:

TABLE E

| $u_7, u_8, u_9$ | $x_2, x_4$ |
|---|---|
| 000 | 11 |
| 100 | 21 |
| 010 | 31 |
| 110 | 12 |
| 001 | 22 |
| 101 | 31 |
| 011 | 13 |
| 111 | 23 |

As an example, it is assumed that due to single symbol errors a code word in the subset is changed to be another code word in the subset. For example, 11 is modified to be 21, and bit tuple 000 will be decided as 001 during demodulation, causing 1 bit error. By listing all cases of such single symbol errors, the total number of resulting bit errors can be evaluated as $$J=\Sigma_{(x_2,x_4)\to(x_2',x_4')}d_H((u_7,u_8,u_9),(u_7',u_8',u_9')) \quad \text{(eq.5)}$$

where $(x_2', x_4')$ is caused by single symbol error applied to $(x_2, x_4)$, and both $(x_2, x_4)$ and $(x_2', x_4')$ are combinations within $S_1$. For the above example, J=51. Totally, there are 8·7·6·5·4·3·2·1=40320 possible mappings between $u_7$, $u_8$, $u_9$ and $x_2$, $x_4$. All mappings are tested with respect to evaluating the cost function (eq.5). The mapping resulting in the minimal J value is selected as an appropriate mapping. One such mapping is shown in the Table F:

TABLE F

| $u_7, u_8, u_9$ | $x_2, x_4$ |
|---|---|
| 000 | 22 |
| 100 | 21 |
| 010 | 32 |
| 110 | 31 |
| 001 | 23 |
| 101 | 13 |
| 011 | 12 |
| 111 | 11 |

Here, the corresponding cost function results in J=36. Consequently, the mapping rule for $S_1$ is found as

TABLE G

| $(u_1, u_2, u_3, u_4, u_5, u_6, u_7, u_8, u_9)$ | $(x_1, x_2, x_3, x_4, x_5)$ |
|---|---|
| 000000000 | 02020 |
| 000000100 | 02010 |
| 000000010 | 03020 |
| 000000110 | 03010 |
| 000000001 | 02030 |
| 000000101 | 01030 |
| 000000011 | 01020 |
| 000000111 | 01010 |

If symbol error probabilities are available, the cost function employing such error probabilities can be used to find an appropriate mapping:

$$J_p=\Sigma_{(x_2,x_4)\to(x_2',x_4')}P\{(x_2,x_4)\to(x_2',x_4')\}d_H((u_7,u_8,u_9),(u_7',u_8',u_9')) \quad \text{(eq.6)}$$

Referring to the neighboring subset graph shown in FIG. 4, the mapping rule between $u_7$, $u_8$, $u_9$ and $x_2$, $x_4$ is also suitable for $S_{13}$. For $S_4$, common assignments between $S_4$ and its neighbors are checked. There are 6 assignments fixed to these for $S_1$, as shown in Table H:

TABLE H

| $u_7, u_8, u_9$ | $x_2, x_4$ |
|---|---|
| 000 | 22 |
| 100 | 21 |
| 001 | 23 |
| 101 | 13 |
| 011 | 12 |
| 111 | 11 |

And there are 6 common assignments between $S_4$ and $S_{52}$ for $x_2, x_4 \in \{22,21,12,11,01,02\}$ and 9 common assignments between $S_4$ and $S_{16}$ for $x_2, x_4 \in \{22,21,23,13,12,11,01,02,03\}$. Therefore, to maximize the for common assignments between neighboring subsets, $x_2, x_4 \in \{22,21,23,13,12,11,01,02\}$ is used to assign 3 bits to them.

Since 6 assignments between $u_7$, $u_8$, $u_9$ and $x_2$, $x_4$ are already fixed, an additional, suitable mapping between $u_7$, $u_8$, $u_9 \in \{010, 110\}$ and $x_2, x_4 \in \{01,02\}$ is determined. Again, cost functions (eq.5) or (eq.6) can be used to find an appropriate mapping, while 6 assignments between $u_7$, $u_8$, $u_9$ and $x_2$, $x_4$ are fixed. And by employing (eq.5), a mapping rule is found for $S_4$, as shown in Table I: (For $S_4$, $x_1=3$, $x_3=x_5=0$)

TABLE I

| $(u_1, u_2, u_3, u_4, u_5, u_6, u_7, u_8, u_9)$ | $(x_1, x_2, x_3, x_4, x_5)$ |
|---|---|
| 110000000 | 32020 |
| 110000100 | 32010 |
| 110000010 | 30020 |
| 110000110 | 30010 |
| 110000001 | 32030 |
| 110000101 | 31030 |
| 110000011 | 31020 |
| 110000111 | 31010 |

Similar procedures can be carried out for other states in the neighboring subset graph FIG. 4. Applying the same procedure for all subsets, a modulation table for code $C_1$ can be obtained as shown in TABLE J below. TABLE J comprises 256 lines and 4 columns, wherein the first and the third column show binary source code words $(u_1, u_2, \ldots, u_8, u_9)$ and the second and the fourth column show quaternary target code words $(x_1, x_2, x_3, x_4, x_5)$ assigned to the source code words in the same line of the first and the third column, respectively, resulting in a code book containing 512 source code word/target code word mappings.

Hence, a method for generating a modulation code with high efficiency is provided that limits run lengths of modulation sequences, avoids self-reverse complementarity, and minimizes the bit error rate after demodulation.

Figure 5:
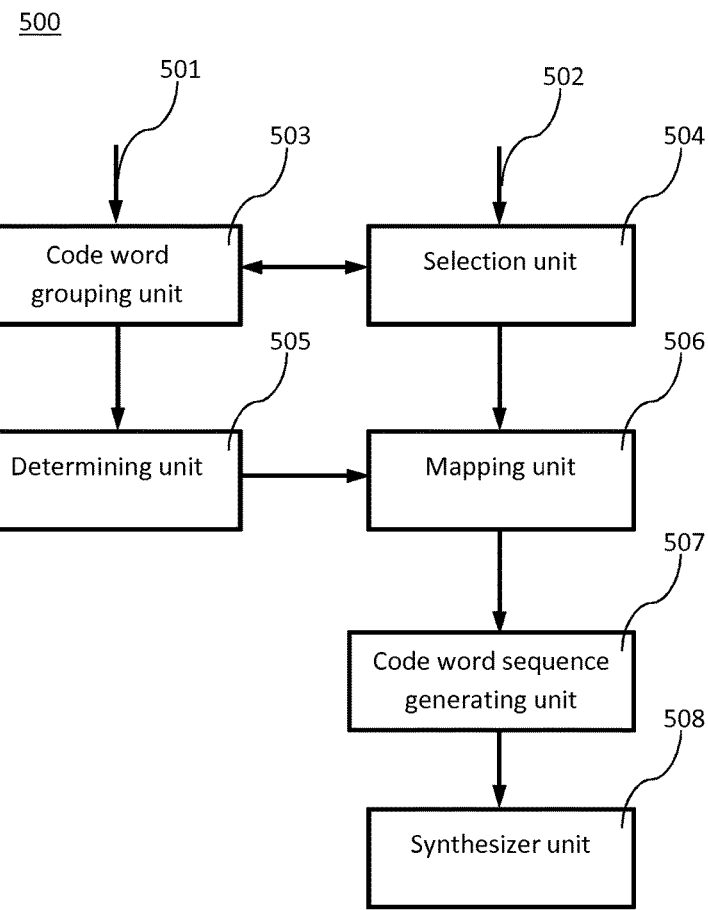
FIG. 5 schematically illustrates an embodiment of a code generating apparatus for mapping a plurality of source code words to a plurality of target code words.

Referring to FIG. 5, an embodiment of a code generating apparatus 500 for mapping a plurality of source code words to a plurality of target code words is schematically illustrated. The shown apparatus allows implementing the advantages and characteristics of the described code book generation method as part of an apparatus for mapping a plurality of source code words to a plurality of target code words.

The apparatus 500 has a first input 501 for receiving target code words and a second input 502 for receiving source code words. In another embodiment, both inputs can be implemented as a single input or interface. The code words are received from a memory device or a processing device arranged to generate the code words. In an embodiment the memory device or processing device can be comprised in the apparatus 500.

The apparatus 500 comprises a code word grouping unit 503 configured to group the plurality of target code words ceased through the first input 501 into a plurality of subsets of the target code words, the target code words comprising an identifying portion and a remaining portion, wherein the identifying portions of the target code words corresponding to a same subset of the plurality of subsets are identical.

The apparatus 500 further comprises a selection unit 504 connected to the code word grouping unit 503 and configured to select a first set of code symbols of the source code words for addressing the plurality of subsets. The source code words are received through the second input 502.

Further, a determining unit 505 is connected to the code word grouping unit 503. It is configured to determine for the subsets one or more corresponding neighboring subsets within the plurality of subsets, wherein the identifying portions of the target code words of the one or more neighboring subsets differ from the identifying portion of the target code words of the corresponding subset by up to a predetermined amount of code symbols.

Further, the apparatus 500 comprises a mapping unit 506 connected at least to the selection unit 504 and the determining unit 505. It is configured to assign source code words where the corresponding first set of code symbols addresses the same subset, to target code words of said subset said source code words are assigned to, such that an amount of the target code words of said subset having their remaining portions identical to the corresponding remaining portions of the target code words of their neighboring subsets corresponds to an optimization criterion, e.g. is maximized.

The generated target code words can be output and stored in a memory etc. In the embodiment shown in FIG. 5, the mapping unit 506 is connected to a code word sequence generating unit 507 which is configured to generate at least one code word sequence from one or more of the target code words. The code word sequences are provided to a synthesizer unit 508 configured to synthesize at least one nucleic acid molecule comprising a segment wherein a sequence of nucleotides is arranged to correspond to the at least one code word sequence.

In the embodiment shown in FIG. 5, the illustrated apparatus 500 comprises the synthesizer unit 508 connected to receive the generated code word sequences. It is configured to synthesize nucleic acid molecules, for example DNA or RNA strands, each containing a segment wherein a sequence of nucleotides is arranged to correspond to a particular code word sequence. In another embodiment, the apparatus does not comprise the synthesizer unit but is connected or connectable to it by means of an interface.

In an embodiment, the apparatus 500 is a device being part of another apparatus or system, such as a storage system, e.g. a DNA storage system or RNA storage system.

The apparatus 500 may, for example, be programmable logic circuitry or a processing device arranged to generate the code, i.e. the code book, connected to or comprising at least one memory device for storing the code.

The code word grouping unit 503, the selection unit 504, the determining unit 505 and the mapping unit 506, and also the code word sequence generating unit 507 may, for example, be provided as separate devices, jointly as at least one device or logic circuitry, or functionality carried out by a microprocessor, microcontroller or other processing device, computer or other programmable apparatus.

As will be appreciated by one skilled in the art, aspects of the present principles can be embodied as an apparatus, a system, method or computer readable medium. Accordingly, aspects of the present principles can take the form of a hardware embodiment, a software embodiment or an embodiment combining software and hardware aspects. Furthermore, aspects of the present principles can take the form of a computer readable storage medium. Any combination of one or more computer readable storage medium(s) may be utilized.

Aspects of the present principles may, for example, at least partly be implemented in a computer program comprising code portions for performing steps of the method according to an embodiment of the present principles when run on a programmable apparatus or enabling a programmable apparatus to perform functions of an apparatus or system according to an embodiment of the present principles.

Further, any shown connection may be a direct or an indirect connection. Furthermore, those skilled in the art will recognize that the boundaries between logic blocks are merely illustrative and that alternative embodiments may merge logic blocks or impose an alternate decomposition of functionality upon various logic blocks.

TABLE J

| $(u_1, u_2, \ldots, u_8, u_9)$ | $(x_1, x_2, x_3, x_4, x_5)$ |
|---|---|
| 000000000 | 02020 |
| 010000000 | 21020 |
| 001000000 | 02120 |
| 011000000 | 23130 |
| 000100000 | 01210 |
| 010100000 | 23230 |
| 001100000 | 02320 |
| 011100000 | 21320 |
| 000010000 | 02021 |
| 010010000 | 23001 |
| 001010000 | 03131 |
| 011010000 | 23131 |
| 000110000 | 03231 |
| 010110000 | 23231 |
| 001110000 | 02321 |
| 011110000 | 23301 |
| 000001000 | 02012 |
| 010001000 | 23002 |
| 001001000 | 03132 |
| 011001000 | 23132 |
| 000101000 | 03232 |
| 010101000 | 23232 |
| 001101000 | 02312 |
| 011101000 | 23302 |
| 000011000 | 02023 |
| 010011000 | 21023 |
| 001011000 | 02123 |
| 011011000 | 23103 |
| 000111000 | 01213 |
| 010111000 | 23203 |
| 001111000 | 02323 |
| 011111000 | 21323 |
| 000000100 | 02010 |
| 010000100 | 21010 |
| 001000100 | 01120 |
| 011000100 | 21130 |
| 000100100 | 01220 |
| 010100100 | 21230 |
| 001100100 | 02310 |
| 011100100 | 21310 |
| 000010100 | 02001 |
| 010010100 | 21001 |
| 001010100 | 02131 |
| 011010100 | 21131 |
| 000110100 | 02231 |
| 010110100 | 21231 |
| 001110100 | 02301 |
| 011110100 | 21301 |
| 000001100 | 02002 |
| 010001100 | 21002 |
| 001001100 | 02132 |
| 011001100 | 21132 |
| 000101100 | 02232 |
| 010101100 | 21232 |
| 001101100 | 02302 |
| 011101100 | 21302 |
| 000011100 | 02013 |
| 010011100 | 21013 |
| 001011100 | 01123 |
| 011011100 | 21113 |
| 000111100 | 01223 |
| 010111100 | 21213 |
| 001111100 | 02313 |
| 011111100 | 21313 |

TABLE J-continued

| $(u_1, u_2, \ldots, u_8, u_9)$ | $(x_1, x_2, x_3, x_4, x_5)$ |
|---|---|
| 000000010 | 03020 |
| 010000010 | 23020 |
| 001000010 | 02130 |
| 011000010 | 23110 |
| 000100010 | 02230 |
| 010100010 | 23210 |
| 001100010 | 03320 |
| 011100010 | 23320 |
| 000010010 | 03021 |
| 010010010 | 21031 |
| 001010010 | 03101 |
| 011010010 | 23101 |
| 000110010 | 03201 |
| 010110010 | 23201 |
| 001110010 | 03321 |
| 011110010 | 21331 |
| 000001010 | 03012 |
| 010001010 | 21032 |
| 001001010 | 03102 |
| 011001010 | 23102 |
| 000101010 | 03202 |
| 010101010 | 23202 |
| 001101010 | 03312 |
| 011101010 | 21332 |
| 000011010 | 03023 |
| 010011010 | 23023 |
| 001011010 | 02103 |
| 011011010 | 23113 |
| 000111010 | 02203 |
| 010111010 | 23213 |
| 001111010 | 03323 |
| 011111010 | 23323 |
| 000000110 | 03010 |
| 010000110 | 23010 |
| 001000110 | 01130 |
| 011000110 | 21120 |
| 000100110 | 01230 |
| 010100110 | 21220 |
| 001100110 | 03310 |
| 011100110 | 23310 |
| 000010110 | 03001 |
| 010010110 | 21021 |
| 001010110 | 02101 |
| 011010110 | 21101 |
| 000110110 | 02201 |
| 010110110 | 21201 |
| 001110110 | 03301 |
| 011110110 | 21321 |
| 000001110 | 03002 |
| 010001110 | 21012 |
| 001001110 | 02102 |
| 011001110 | 21102 |
| 000101110 | 02202 |
| 010101110 | 21202 |
| 001101110 | 03302 |
| 011101110 | 21312 |
| 000011110 | 03013 |
| 010011110 | 23013 |
| 001011110 | 01103 |
| 011011110 | 21123 |
| 000111110 | 01203 |
| 010111110 | 21223 |
| 001111110 | 03313 |
| 011111110 | 23313 |
| 000000001 | 02030 |
| 010000001 | 21030 |
| 001000001 | 02110 |
| 011000001 | 23120 |
| 000100001 | 02210 |
| 010100001 | 23220 |
| 001100001 | 02330 |
| 011100001 | 21330 |
| 000010001 | 02031 |
| 010010001 | 23031 |
| 001010001 | 03121 |
| 011010001 | 23121 |
| 000110001 | 03221 |
| 010110001 | 23221 |
| 001110001 | 02331 |
| 011110001 | 20301 |
| 000001001 | 02032 |
| 010001001 | 23032 |
| 001001001 | 02112 |
| 011001001 | 23112 |
| 000101001 | 02212 |
| 010101001 | 23212 |
| 001101001 | 02332 |
| 011101001 | 23332 |
| 000011001 | 02003 |
| 010011001 | 23003 |
| 001011001 | 02113 |
| 011011001 | 23123 |
| 000111001 | 02213 |
| 010111001 | 23223 |
| 001111001 | 02303 |
| 011111001 | 23303 |
| 000000101 | 01030 |
| 010000101 | 20030 |
| 001000101 | 03120 |
| 011000101 | 20130 |
| 000100101 | 03220 |
| 010100101 | 20230 |
| 001100101 | 01330 |
| 011100101 | 20330 |
| 000010101 | 01031 |
| 010010101 | 23021 |
| 001010101 | 01131 |
| 011010101 | 20131 |
| 000110101 | 01231 |
| 010110101 | 20231 |
| 001110101 | 01331 |
| 011110101 | 23321 |
| 000001101 | 01032 |
| 010001101 | 23012 |
| 001001101 | 01132 |
| 011001101 | 20132 |
| 000101101 | 01232 |
| 010101101 | 20232 |
| 001101101 | 01332 |
| 011101101 | 23312 |
| 000011101 | 01003 |
| 010011101 | 20003 |
| 001011101 | 03123 |
| 011011101 | 20103 |
| 000111101 | 03223 |
| 010111101 | 20203 |
| 001111101 | 01303 |
| 011111101 | 20303 |
| 000000011 | 01020 |
| 010000011 | 20020 |
| 001000011 | 03110 |
| 011000011 | 20120 |
| 000100011 | 03210 |
| 010100011 | 20220 |
| 001100011 | 01320 |
| 011100011 | 20320 |
| 000010011 | 01021 |
| 010010011 | 20031 |
| 001010011 | 01121 |
| 011010011 | 20121 |
| 000110011 | 01221 |
| 010110011 | 20221 |
| 001110011 | 01321 |
| 011110011 | 20331 |
| 000001011 | 01012 |
| 010001011 | 20032 |
| 001001011 | 03112 |
| 011001011 | 20112 |
| 000101011 | 03212 |
| 010101011 | 20212 |
| 001101011 | 01312 |
| 011101011 | 20332 |
| 000011011 | 01023 |
| 010011011 | 20023 |
| 001011011 | 03113 |
| 011011011 | 20123 |

TABLE J-continued

| $(u_1, u_2, \ldots, u_8, u_9)$ | $(x_1, x_2, x_3, x_4, x_5)$ |
|---|---|
| 000111011 | 03213 |
| 010111011 | 20223 |
| 001111011 | 01323 |
| 011111011 | 20323 |
| 000000111 | 01010 |
| 010000111 | 20010 |
| 001000111 | 03130 |
| 011000111 | 20110 |
| 000100111 | 03230 |
| 010100111 | 20210 |
| 001100111 | 01310 |
| 011100111 | 20310 |
| 000010111 | 01001 |
| 010010111 | 20021 |
| 001010111 | 01101 |
| 011010111 | 20101 |
| 000110111 | 01201 |
| 010110111 | 20201 |
| 001110111 | 01301 |
| 011110111 | 20321 |
| 000001111 | 01002 |
| 010001111 | 20012 |
| 001001111 | 01102 |
| 011001111 | 20102 |
| 000101111 | 01202 |
| 010101111 | 20202 |
| 001101111 | 01302 |
| 011101111 | 20312 |
| 000011111 | 01013 |
| 010011111 | 20013 |
| 001011111 | 03103 |
| 011011111 | 20113 |
| 000111111 | 03203 |
| 010111111 | 20213 |
| 001111111 | 01313 |
| 011111111 | 20313 |
| 100000000 | 12020 |
| 110000000 | 32020 |
| 101000000 | 13130 |
| 111000000 | 32120 |
| 100100000 | 13230 |
| 110100000 | 31210 |
| 101100000 | 12320 |
| 111100000 | 32320 |
| 100010000 | 13001 |
| 110010000 | 32021 |
| 101010000 | 13131 |
| 111010000 | 30131 |
| 100110000 | 13231 |
| 110110000 | 30231 |
| 101110000 | 13301 |
| 111110000 | 32321 |
| 100001000 | 13002 |
| 110001000 | 32012 |
| 101001000 | 13132 |
| 111001000 | 30132 |
| 100101000 | 13232 |
| 110101000 | 30232 |
| 101101000 | 13302 |
| 111101000 | 32312 |
| 100011000 | 12023 |
| 110011000 | 32023 |
| 101011000 | 13103 |
| 111011000 | 32123 |
| 100111000 | 13203 |
| 110111000 | 32223 |
| 101111000 | 12323 |
| 111111000 | 32323 |
| 100000100 | 12010 |
| 110000100 | 32010 |
| 101000100 | 12130 |
| 111000100 | 31120 |
| 100100100 | 12230 |
| 110100100 | 31220 |
| 101100100 | 12310 |
| 111100100 | 32310 |
| 100010100 | 12001 |
| 110010100 | 32001 |
| 101010100 | 12131 |
| 111010100 | 32131 |
| 100110100 | 12231 |
| 110110100 | 32231 |
| 101110100 | 12301 |
| 111110100 | 32301 |
| 100001100 | 12002 |
| 110001100 | 32002 |
| 101001100 | 12132 |
| 111001100 | 32132 |
| 100101100 | 12232 |
| 110101100 | 32232 |
| 101101100 | 12302 |
| 111101100 | 32302 |
| 100011100 | 12013 |
| 110011100 | 32013 |
| 101011100 | 12103 |
| 111011100 | 31123 |
| 100111100 | 12203 |
| 110111100 | 31223 |
| 101111100 | 12313 |
| 111111100 | 32313 |
| 100000010 | 13020 |
| 110000010 | 30020 |
| 101000010 | 13110 |
| 111000010 | 32130 |
| 100100010 | 13210 |
| 110100010 | 32230 |
| 101100010 | 13320 |
| 111100010 | 30320 |
| 100010010 | 12031 |
| 110010010 | 30021 |
| 101010010 | 13101 |
| 111010010 | 30101 |
| 100110010 | 13201 |
| 110110010 | 30201 |
| 101110010 | 12331 |
| 111110010 | 30321 |
| 100001010 | 12032 |
| 110001010 | 30012 |
| 101001010 | 13102 |
| 111001010 | 30102 |
| 100101010 | 13202 |
| 110101010 | 30202 |
| 101101010 | 12332 |
| 111101010 | 30312 |
| 100011010 | 13023 |
| 110011010 | 30023 |
| 101011010 | 13113 |
| 111011010 | 32103 |
| 100111010 | 13213 |
| 110111010 | 32203 |
| 101111010 | 13323 |
| 111111010 | 30323 |
| 100000110 | 13010 |
| 110000110 | 30010 |
| 101000110 | 12110 |
| 111000110 | 31130 |
| 100100110 | 12210 |
| 110100110 | 31230 |
| 101100110 | 13310 |
| 111100110 | 30310 |
| 100010110 | 12021 |
| 110010110 | 30031 |
| 101010110 | 12101 |
| 111010110 | 32101 |
| 100110110 | 12201 |
| 110110110 | 32201 |
| 101110110 | 12321 |
| 111110110 | 30331 |
| 100001110 | 12012 |
| 110001110 | 30032 |
| 101001110 | 12102 |
| 111001110 | 32102 |
| 100101110 | 12202 |
| 110101110 | 32202 |
| 101101110 | 12312 |
| 111101110 | 30332 |

TABLE J-continued

| $(u_1, u_2, \ldots, u_8, u_9)$ | $(x_1, x_2, x_3, x_4, x_5)$ |
|---|---|
| 100011110 | 13013 |
| 110011110 | 30013 |
| 101011110 | 12113 |
| 111011110 | 31103 |
| 100111110 | 12213 |
| 110111110 | 31203 |
| 101111110 | 13313 |
| 111111110 | 30313 |
| 100000001 | 12030 |
| 110000001 | 32030 |
| 101000001 | 13120 |
| 111000001 | 32110 |
| 100100001 | 13220 |
| 110100001 | 32210 |
| 101100001 | 12330 |
| 111100001 | 32330 |
| 100010001 | 13031 |
| 110010001 | 32031 |
| 101010001 | 13121 |
| 111010001 | 30121 |
| 100110001 | 13221 |
| 110110001 | 30221 |
| 101110001 | 10301 |
| 111110001 | 32331 |
| 100001001 | 13032 |
| 110001001 | 32032 |
| 101001001 | 13112 |
| 111001001 | 32112 |
| 100101001 | 13212 |
| 110101001 | 32212 |
| 101101001 | 10302 |
| 111101001 | 32332 |
| 100011001 | 13003 |
| 110011001 | 32003 |
| 101011001 | 13123 |
| 111011001 | 32113 |
| 100111001 | 13223 |
| 110111001 | 32213 |
| 101111001 | 13303 |
| 111111001 | 32303 |
| 100000101 | 10030 |
| 110000101 | 31030 |
| 101000101 | 10130 |
| 111000101 | 30120 |
| 100100101 | 10230 |
| 110100101 | 30220 |
| 101100101 | 10330 |
| 111100101 | 31330 |
| 100010101 | 13021 |
| 110010101 | 31031 |
| 101010101 | 10131 |
| 111010101 | 31131 |
| 100110101 | 10231 |
| 110110101 | 31231 |
| 101110101 | 13321 |
| 111110101 | 31331 |
| 100001101 | 13012 |
| 110001101 | 31032 |
| 101001101 | 10132 |
| 111001101 | 31132 |
| 100101101 | 10232 |
| 110101101 | 31232 |
| 101101101 | 13312 |
| 111101101 | 31332 |
| 100011101 | 12003 |
| 110011101 | 31003 |
| 101011101 | 10103 |
| 111011101 | 30123 |
| 100111101 | 10203 |
| 110111101 | 30223 |
| 101111101 | 12303 |
| 111111101 | 31303 |
| 100000011 | 10020 |
| 110000011 | 31020 |
| 101000011 | 10120 |
| 111000011 | 30110 |
| 100100011 | 10220 |
| 110100011 | 30210 |
| 101100011 | 10320 |
| 111100011 | 31320 |
| 100010011 | 10031 |
| 110010011 | 31021 |
| 101010011 | 10121 |
| 111010011 | 31121 |
| 100110011 | 10221 |
| 110110011 | 31221 |
| 101110011 | 10331 |
| 111110011 | 31321 |
| 100001011 | 10032 |
| 110001011 | 31012 |
| 101001011 | 10112 |
| 111001011 | 30112 |
| 100101011 | 10212 |
| 110101011 | 30212 |
| 101101011 | 10332 |
| 111101011 | 31312 |
| 100011011 | 10023 |
| 110011011 | 31023 |
| 101011011 | 10123 |
| 111011011 | 30113 |
| 100111011 | 10223 |
| 110111011 | 30213 |
| 101111011 | 10323 |
| 111111011 | 31323 |
| 100000111 | 10010 |
| 110000111 | 31010 |
| 101000111 | 10110 |
| 111000111 | 30130 |
| 100100111 | 10210 |
| 110100111 | 30230 |
| 101100111 | 10310 |
| 111100111 | 31310 |
| 100010111 | 10021 |
| 110010111 | 31001 |
| 101010111 | 10101 |
| 111010111 | 31101 |
| 100110111 | 10201 |
| 110110111 | 31201 |
| 101110111 | 10321 |
| 111110111 | 31301 |
| 100001111 | 10012 |
| 110001111 | 31002 |
| 101001111 | 10102 |
| 111001111 | 31102 |
| 100101111 | 10202 |
| 110101111 | 31202 |
| 101101111 | 10312 |
| 111101111 | 31302 |
| 100011111 | 10013 |
| 110011111 | 31013 |
| 101011111 | 10113 |
| 111011111 | 30103 |
| 100111111 | 10213 |
| 110111111 | 30203 |
| 101111111 | 10313 |
| 111111111 | 31313 |

The invention claimed is:

1. A computer-implemented code book generation method for mapping a plurality of source code words to a plurality of target code words comprising code symbols corresponding to nucleotides, comprising
   providing a plurality of source code words and a plurality of target code words;
   grouping the plurality of target code words into a plurality of subsets of the target code words, the target code words comprising an identifying portion and a remaining portion, wherein the identifying portions of the target code words corresponding to a same subset of the plurality of subsets are identical;
   selecting a first set of code symbols of the source code words to be associated with the plurality of subsets;

determining for the subsets one or more corresponding neighboring subsets within the plurality of subsets, wherein the identifying portions of the target code words of the one or more neighboring subsets differ from the identifying portion of the target code words of the corresponding subset by up to a predetermined amount of code symbols; and assigning source code words where the corresponding first set of code symbols is associated with the same subset, to target code words of said subset such that an amount of the target code words of said subset said source code words are assigned to, having their remaining portions identical to the corresponding remaining portions of the target code words of their neighboring subsets corresponds to an optimization criterion.

2. Method according to claim 1, comprising removing target code words from the plurality of target code words according to a decoding related criterion before grouping the plurality of target code words into a plurality of subsets of the target code words.

3. Method according to claim 2, wherein according to the decoding related criterion target code words that comprise a run length of identical code symbols of more than a predefined maximum run length are removed.

4. Method according to claim 3, wherein target code words that comprise a run length of identical code symbols of more than the predefined maximum run length when being concatenated with another of the target code words are removed.

5. Method according to claim 1, wherein said determining comprises that the identifying portions of the one or more neighboring subsets differ from the corresponding subset by selected symbol flips corresponding to dominant sequencing errors based on a sequencing error probability of nucleotides within nucleic acid strands.

6. Method according to claim 1, wherein the pluralities of source code words and target code words are divided into source code words and target code words of a first code and of a second code, the target code words of the first code and of the second code both having the properties that the reverse complementary word of a target code word of the corresponding code still belongs to the corresponding code, and that there is no common code word between the first code and the second code, and that a target code word of the second code is neither equal to any portion of two cascaded target code words of the first code nor equal to any portion of cascaded one target code word of the first code and one target code word of the second code, and wherein the grouping, selecting, determining and assigning is applied to the first code.

7. Method according to claim 6, wherein the second code is generated according to the following:

grouping the plurality of target code words of the second code into a plurality of subsets of the target code words of the second code, the target code words of the second code comprising an identifying portion and a remaining portion, wherein the identifying portions of the target code words of the second code corresponding to a same subset of the plurality of subsets of target code words of the second code are identical;

selecting a first set of code symbols of the source code words of the second code to be associated with the plurality of subsets of target code words of the second code;

assigning source code words of the second code where the corresponding first set of code symbols is associated with the same subset of target code words of the second code, to said subset according to a cost function minimizing a Hamming distance between the remaining portions of the target code words of the second code.

8. Method according to claim 7, wherein the cost function depends on a symbol error probability.

9. Method according to claim 8, wherein the symbol error probability is based on a sequencing error probability of nucleotides within nucleic acid strands.

10. Method according to claim 1, comprising
generating at least one code word sequence from one or more of the target code words; and
synthesizing at least one nucleic acid molecule comprising a segment wherein a sequence of nucleotides is arranged to correspond to the at least one code word sequence.

11. Code generating apparatus for mapping a plurality of source code words to a plurality of target code words comprising code symbols corresponding to nucleotides, comprising
a first input for receiving target code words and a second input for receiving source code words;
a code word grouping unit configured to group the plurality of target code words into a plurality of subsets of the target code words, the target code words comprising an identifying portion and a remaining portion, wherein the identifying portions of the target code words corresponding to a same subset of the plurality of subsets are identical;
a selection unit connected to the code word grouping unit and configured to select a first set of code symbols of the source code words to be associated with the plurality of subsets;
a determining unit connected to the code word grouping unit and configured to determine for the subsets one or more corresponding neighboring subsets within the plurality of subsets, wherein the identifying portions of the target code words of the one or more neighboring subsets differ from the identifying portion of the target code words of the corresponding subset by up to a predetermined amount of code symbols; and
a mapping unit connected to the selection unit and the determining unit and configured to assign source code words where the corresponding first set of code symbols is associated with the same subset, to target code words of said subset such that an amount of the target code words of said subset said source code words are assigned to, having their remaining portions identical to the corresponding remaining portions of the target code words of their neighboring subsets corresponds to an optimization criterion.

12. Apparatus according to claim 11, comprising
a code word sequence generating unit configured to generate at least one code word sequence from one or more of the target code words; and
a synthesizer unit configured to synthesize at least one nucleic acid molecule comprising a segment wherein a sequence of nucleotides is arranged to correspond to the at least one code word sequence.

13. Computer readable storage medium having stored therein instructions enabling mapping a plurality of source code words to a plurality of target code words comprising code symbols corresponding to nucleotides, which, when executed by a computer, cause the computer to:
provide a plurality of source code words and a plurality of target code words;
group the plurality of target code words into a plurality of subsets of the target code words, the target code words comprising an identifying portion and a remaining portion, wherein the identifying portions of the target code words corresponding to a same subset of the plurality of subsets are identical;

select a first set of code symbols of the source code words to be associated with the plurality of subsets;

determine for the subsets one or more corresponding neighboring subsets within the plurality of subsets, wherein the identifying portions of the target code words of the one or more neighboring subsets differ from the identifying portion of the target code words of the corresponding subset by up to a predetermined amount of code symbols; and assign source code words where the corresponding first set of code symbols is associated with the same subset, to target code words of said subset such that an amount of the target code words of said subset said source code words are assigned to, having their remaining portions identical to the corresponding remaining portions of the target code words of their neighboring subsets corresponds to an optimization criterion.

* * * * *